United States Patent
Han et al.

(10) Patent No.: US 10,476,230 B2
(45) Date of Patent: Nov. 12, 2019

(54) ETALON-BASED WAVELENGTH LOCKING APPARATUS AND ALIGNMENT METHOD

(71) Applicants: Xiaofeng Han, Allentown, PA (US);
Timothy Butrie, Hellertown, PA (US);
David Coult, Oley, PA (US)

(72) Inventors: Xiaofeng Han, Allentown, PA (US);
Timothy Butrie, Hellertown, PA (US);
David Coult, Oley, PA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 13/732,100

(22) Filed: Dec. 31, 2012

(65) Prior Publication Data

US 2014/0185045 A1    Jul. 3, 2014

(51) Int. Cl.
| | |
|---|---|
| *G01B 9/02* | (2006.01) |
| *G01B 11/00* | (2006.01) |
| *G01J 3/45* | (2006.01) |
| *H01S 3/10* | (2006.01) |
| *H01S 3/08* | (2006.01) |
| *G02B 6/26* | (2006.01) |
| *G02B 6/42* | (2006.01) |
| *H01S 5/0687* | (2006.01) |
| *H01S 5/0683* | (2006.01) |

(52) U.S. Cl.
CPC ........ *H01S 5/0687* (2013.01); *H01S 5/06837* (2013.01)

(58) Field of Classification Search
CPC ........ G01J 1/16; G01J 2009/0257; G01J 9/02; G01J 9/0246; G01B 11/272; H01S 5/0687; H01S 5/06837; H01S 5/06804; H01S 5/4025; H01S 5/06808; H01S 5/141; H01S 5/06255; H01S 5/005; H04B 10/503; H04B 10/572; H04B 10/506; H04B 10/564; H04B 10/504
USPC ..... 356/400, 454, 519; 250/205; 385/39, 27, 385/15, 24; 372/32
See application file for complete search history.

(56) References Cited

U.S. PATENT DOCUMENTS 8,155,488 B2    4/2012   Nilsson
2002/0164125 A1*   11/2002   Berger et al. .......... 385/39
(Continued)

*Primary Examiner* — Sunghee Y Gray
(74) *Attorney, Agent, or Firm* — David L. Soltz

(57) ABSTRACT

Consistent with the present disclosure, an apparatus for producing a control signal for a laser source is provided, comprising an etalon configured to receive light from the laser source and control circuitry that provides the control signal, wherein the control signal is indicative of a comparison of (a) a difference between a forward transmission signal of the etalon and a backward reflection signal of the etalon and (b) the light received by the etalon from the laser source. Alternatively, the control signal is indicative of a comparison of (a) a difference between a forward transmission signal of the etalon and a backward reflection signal of the etalon and (b) a combination of the forward transmission signal of the etalon and the backward reflection signal of the etalon. Also consistent with the present disclosure, a method of aligning an etalon-based wavelength locking apparatus is provided, wherein the etalon of the apparatus is aligned with an optical axis along a direction of propagation of the output of the laser source by monitoring the signals indicative of the forward transmission signal and the backward reflection signal of the etalon.

5 Claims, 15 Drawing Sheets

(56) References Cited

U.S. PATENT DOCUMENTS

| | | | |
|---|---|---|---|
| 2003/0035119 A1* | 2/2003 | Myatt | G01J 9/0246 |
| | | | 356/519 |
| 2003/0116695 A1* | 6/2003 | Masuda et al. | 250/205 |
| 2003/0173505 A1 | 9/2003 | Wipiejewski | |
| 2005/0062976 A1* | 3/2005 | Morris | 356/454 |
| 2006/0192970 A1* | 8/2006 | Tiemann | H01S 3/13 |
| | | | 356/454 |
| 2009/0316739 A1* | 12/2009 | Yokoyama | H01S 5/0687 |
| | | | 372/32 |

* cited by examiner

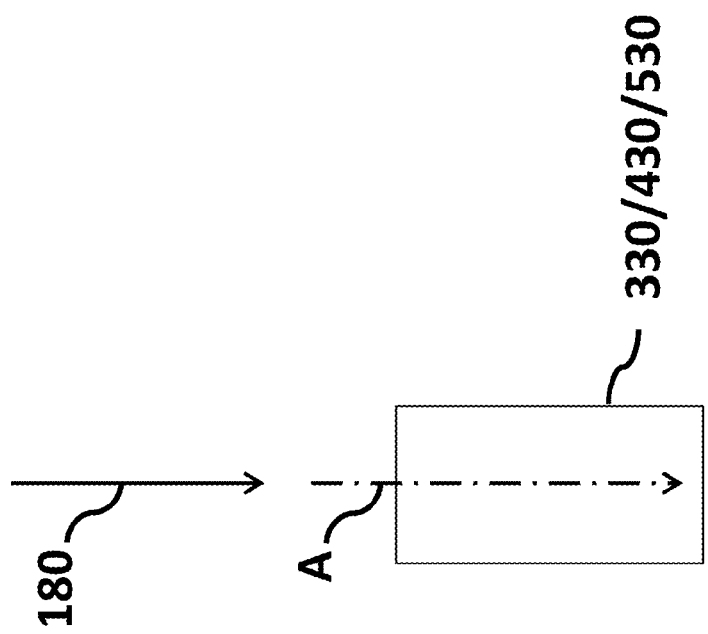

ETALON-BASED WAVELENGTH LOCKING APPARATUS AND ALIGNMENT METHOD

BACKGROUND

Optical devices, such as lasers, detectors, and filters, have been proposed for a variety of applications, including telecommunications systems, medical instrumentation, and optical computing. For many of these applications, it is desired that the output signal from the optical device have a stable wavelength within predetermined limits.

For example, maintaining the accuracy of a laser output wavelength is critical for the successful deployment of a practical dense wavelength division multiplexed (DWDM) optical communications system. However, in such systems, the wavelength of the laser output shifts over time, for example, due to temperature changes and/or aging of the laser. These wavelength shifts may be corrected by the use of a wavelength locker and associated control circuitry to monitor the laser output and actively stabilize the laser wavelength by providing a stabilizing control signal to the laser. Use of such wavelength locking arrangements ensures that, over the lifetime of the DWDM system, the wavelength of the laser output does not drift to interfere with an adjacent wavelength channel or lose optical power in the desired channel.

One known type of wavelength locker utilizes a Fabry-Pérot etalon, which is typically made of a transparent plate with two reflecting surfaces separated by a cavity. The cavity may be formed inside a material, in the case of a solid etalon, or by an air space between the reflecting surfaces, in the case of an air-gap etalon. Light entering the etalon resonates in the cavity by internal reflection off the reflecting surfaces and as a result the etalon's forward transmission and backward reflection signals vary periodically as a function of wavelength.

Traditional etalon-based wavelength lockers used in telecommunications employ a first photodiode to detect the etalon forward transmission signal and a second photodiode to detect light tapped off of the laser output before the etalon. A comparison of the signals generated by the two photodiodes can be used to generate a control signal, which is used to tune and thereby lock the laser to a desired wavelength.

For example, FIG. 1 illustrates a prior art etalon-based wavelength locking arrangement 10 for use in an optical telecommunications system. Wavelength locking arrangement 10 comprises a laser source 12, an optical power tap 14, an etalon-based wavelength locker 20 and control circuitry 24. During operation, the optical output of laser source 12 is divided by power tap 14 into a first portion 16, which is provided as an output signal of wavelength locking arrangement 10, and a second portion 18, which is provided as an input to wavelength locker 20. Wavelength locker 20 processes second portion 18 to generate wavelength locker signals 22, which are provided to control circuitry 24. Control circuitry 24 processes wavelength locker signals 22 to produce control signal 26. Control signal 26 is used to control laser source 12 such that laser source 12 maintains a desired wavelength within desired parameters.

As shown in FIG. 2A, wavelength locker 20 comprises a beam splitter 30, photodiodes 32 and 36, and an etalon 34. Second portion 18 of the laser output is split by beam splitter 30 and provided to both photodiode 32 and etalon 34 as shown. The forward transmission signal of etalon 34 is provided to photodiode 36. Photodiodes 32 and 36 generate electrical signals PDref and PDforward, respectively, from their respective inputs. PDref and PDforward are provided to control circuitry 24 as wavelength locker signals 22 (FIG. 1).

As shown in FIG. 2B, an alternative arrangement of wavelength locker 20 comprises a beam splitter 40, photodiodes 42 and 46, and an etalon 44. Second portion 18 of the laser output is split by beam splitter 40 and provided to both photodetector 42 and etalon 44. The forward transmission signal of etalon 44 is provided to photodetector 46. Photodetectors 42 and 46 generate electrical signals PDref and PDforward, respectively, from their respective inputs as shown. Like the arrangement of FIG. 2A, PDref and PDforward generated by the arrangement of FIG. 2B are provided to control circuitry 24 as wavelength locker signals 22 (FIG. 1).

As shown in FIG. 3, control circuitry 24 comprises gain-adjustable transimpedance amplifiers 36 and a comparator 38. Amplifiers 36 convert wavelength locker signals 22 (PDref and PDforward) to voltage outputs, which are compared by comparator 38 to produce control signal 26.

One problem with the prior art etalon-based wavelength locking arrangement 10 is that it suffers from certain design tradeoffs. For example, when using an etalon-based wavelength locking arrangement to lock a laser wavelength, a steep slope in the etalon forward transmission signal versus frequency plot is often desirable about the locking frequency. The finesse of the etalon directly determines the slope of the peak at the locking frequency, i.e., the "locking slope," and the locking slope, in turn, determines the sensitivity of the wavelength locking arrangement. A large slope provides larger feedback signals for smaller deviations in frequency from the locking frequency than a smaller slope. However, the minimum slope of wavelength locking arrangement 10 is lower than desired. Therefore an engineering tradeoff must be analyzed for locking slope versus capture range for acquiring lock. With the prior art wavelength locking arrangement 10, this tradeoff is not ideal, and either slope or capture range must be compromised.

In order to understand the compromise between capture range and locking slope of the prior art wavelength locking arrangement 10, one must consider that the forward transmission signal (T) of an etalon, i.e. normalized PDforward, is given by:

$$T = \frac{1}{1 + \mathcal{F}\sin^2\left(\frac{\pi f}{FSR}\right)}$$

and the free spectral range (FSR) is given by:

$$FSR = \frac{c}{2nd\cos(\theta_{in})}$$

where f is frequency, c the speed of light, n the index of refraction of the etalon material, d the length of the etalon, and $\theta_{in}$ the internal angle of the light beam in the etalon. The coefficient of finesse ($\mathcal{F}$) of the etalon is given by:

$$\mathcal{F} = \left(\frac{2r}{1-r^2}\right)^2$$

where r is the amplitude-reflection coefficient of etalon end-surfaces, and the interference contrast ratio (CR) of the etalon is given by:

$$CR = 10 \log_{10}(1 + \mathcal{F})$$

From the foregoing, one may determine the slope of PDforward as follows:

$$\frac{\partial T}{\partial f} = \frac{-\pi \mathcal{F} \sin\left(\frac{2\pi f}{FSR}\right)}{FSR} T^2$$

Thus, the slope of PDforward depends on the contrast ratio (CR) of etalon 34/44 for a certain free spectral range (FSR).

FIG. 4 shows an example of signal PDforward and its slope for the prior art wavelength locking arrangement 10 with FSR=25 GHz, CR=5 dB, and beamsplitter transmittance, τ=30%. Thus, in this example, the minimum slope of PDforward is 0.31 dB/GHz, the maximum slope of PDforward is 0.66 dB/GHz, and the capture range of etalon 34/44 is 7.3 GHz (assuming a window defined by 0.5 db below the PDforward maximum and 0.5 dB above the PDforward minimum). The goal is to have a large capture range and to increase the minimum slope as much as possible.

FIG. 5 illustrates the dependence of the slope of PDforward and capture range of etalon 34/44 on the contrast ratio (CR) of etalon 34/44. As shown in FIG. 5, both the slope of PDforward and the capture range of etalon 34/44 increase with contrast ratio (CR) of the etalon 34/44. For a low contrast ratio (CR), the difference in slope of PDforward from max to min is small and the control circuitry 24 is better able to track changes in the output frequency of laser source 12. However, the capture range of etalon 34/44 is also small such that the output signal of laser source 12 may drift in frequency outside the ability of the wavelength locking arrangement 10 to correct. In addition, the minimum slope is small so sensitivity is low. On the other hand, for a high contrast ratio (CR), etalon 34/44 may achieve a wider capture range, but the difference in slope of PDforward from max to min is also wider, which may result in control circuitry 24 having difficulty tracking changes in output frequency of laser source 12. The minimum slope also remains low and contributes to poor sensitivity. Thus, with the prior art etalon-based wavelength locking arrangement 10, although increasing the contrast ratio of etalon 34/44 will result in an increased capture range, it does not result in the minimum slope increasing enough to give good sensitivity. PDforward also and has a wide difference in slope as shown in FIG. 5.

In etalon-based wavelength lockers it is very important that the optical axis of the resonant cavity of the etalon be aligned very precisely (preferably parallel) to the direction of propagation of the incoming light. If not, the contrast ratio drops very quickly, FSR increases and the locking frequency changes. Another limitation of the prior art etalon-based wavelength locking arrangement 10 is that it is difficult to align etalon 34/44 angularly because only the forward transmission signal of etalon 34/44 is available for use during the alignment process. An angular misalignment that would result in a measurable change in the backward reflection signal of etalon 34/44 may result in only a small change in the forward transmission signal of etalon 34/44. This makes angular alignment using only PDforward very difficult. In certain optical systems, an optical tap is used temporarily to gain access to the etalon backward reflection signal to aid in angular alignment. However, in small, integrated optical systems, this is very difficult to do.

An etalon-based wavelength locking arrangement is therefore needed that has both improved capture range and improved locking slope across the capture range. An etalon-based wavelength locking arrangement is also needed that allows for better control of angular alignment during assembly.

SUMMARY

Consistent with a first aspect of the present disclosure, an apparatus for producing a control signal for a laser source is provided comprising an etalon configured to receive light from the laser source, a first detector that detects a forward transmission signal of the etalon to provide a first signal, a second detector that detects a backward reflection signal of the etalon to provide a second signal, a third detector that detects the light from the laser source to provide a third signal, and circuitry that provides the control signal based on the first signal, the second signal and the third signal.

In the apparatus consistent with the first aspect of the present disclosure, the control signal is indicative of a comparison of (a) a difference between the first and second signals and (b) the third signal.

In the apparatus consistent with the first aspect of the present disclosure, the etalon is a Fabry-Perot etalon.

In the apparatus consistent with the first aspect of the present disclosure, each of the first, second, and third detectors is a photodiode.

In the apparatus consistent with the first aspect of the present disclosure, the circuitry includes an operational amplifier arranged to subtract the second signal from the first signal to produce a fourth signal indicative of the difference between the first signal and the second signal, and a comparator arranged to compare the fourth signal to the third signal.

Consistent with a second aspect of the present disclosure, an apparatus for producing a control signal for a laser source is provided comprising an etalon configured to receive light from the laser source, a first detector that detects a forward transmission signal of the etalon to provide a first signal, a second detector that detects a backward reflection signal of the etalon to provide a second signal, and circuitry that provides the control signal from the first signal, the second signal, and a third signal, the third signal being derived from the first signal and the second signal.

In the apparatus consistent with the second aspect of the present disclosure, the control signal is indicative of a comparison of (a) a difference between the first signal and the second signal and (b) the third signal.

In the apparatus consistent with the second aspect of the present disclosure, the third signal is indicative of a combination of the first signal and the second signal.

In the apparatus consistent with the second aspect of the present disclosure, the etalon is a Fabry-Perot etalon.

In the apparatus consistent with the second aspect of the present disclosure, each of the first and second detectors is a photodiode.

In the apparatus consistent with the second aspect of the present disclosure, the circuitry includes, a first operational amplifier arranged to subtract the second signal from the first signal to produce the fourth signal indicative of the difference between the first signal and the second signal, a second operational amplifier arranged to add the second signal to the first signal to produce the third signal, and a comparator arranged to compare the fourth signal to the third signal.

Consistent with a third aspect of the present disclosure, a method of aligning an etalon-based wavelength locker with an output of a laser source is provided, the method comprising providing an etalon, providing a first detector that detects a forward transmission signal of the etalon to provide a first signal, providing a second detector that detects a backward reflection signal of the etalon to provide a second signal, and aligning the etalon with an optical axis along a direction of propagation of the output of the laser source by monitoring the first signal and the second signal or by monitoring signals indicative of the first signal and the second signal.

Also consistent with the third aspect of the present disclosure, the method further comprises detecting when the second signal or the signal indicative of the second signal reaches a maximum value.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) of the invention and together with the description, serve to explain the principles of the invention.

BRIEF DESCRIPTION OF THE DRAWINGS

FIG. 15 illustrates alignment of an etalon optical axis with the direction of propagation of an incoming light.

DESCRIPTION OF THE EMBODIMENTS

Consistent with the present disclosure, an apparatus for producing a control signal for a laser source is provided, comprising an etalon configured to receive light from the laser source and control circuitry that provides the control signal, wherein the control signal is indicative of a comparison of (a) a difference between a forward transmission signal of the etalon and a backward reflection signal of the etalon and (b) the light received by the etalon from the laser source. By providing the control signal in this manner, the present invention provides a wavelength locking arrangement with improved locking slope and capture range characteristics.

Also consistent with the present disclosure, an apparatus for producing a control signal for a laser source is provided, comprising an etalon configured to receive light from the laser source and control circuitry that provides the control signal, wherein the control signal is indicative of a comparison of (a) a difference between a forward transmission signal of the etalon and a backward reflection signal of the etalon and (b) a combination of the forward transmission signal of the etalon and the backward reflection signal of the etalon. By providing the control signal in this manner, the present invention provides a wavelength locking arrangement with improved locking slope and capture range characteristics and a simplified design.

Also consistent with the present disclosure, a method of aligning an etalon-based wavelength locking apparatus is provided wherein the etalon of the apparatus is aligned with an optical axis along a direction of propagation of the output of the laser source by monitoring the signals indicative of the forward transmission signal and the backward reflection signal of the etalon. By monitoring signals indicative of both the etalon forward transmission signal and the etalon backward reflection signal, accurate alignment of the optical axis of the etalon with the direction of propagation of the incoming light can be facilitated even when the etalon wavelength locking arrangement is provided as part of a small, integrated optical system.

Various examples of wavelength locking arrangements, their associated components, including wavelength lockers and control circuitry, and alignment methods, each consistent with the present disclosure, are discussed below. Reference will now be made in detail to the present exemplary embodiments of the present disclosure, which are illustrated in the accompanying drawings. Wherever possible, the same reference numbers will be used throughout the drawings to refer to the same or like parts.

Figure 1:
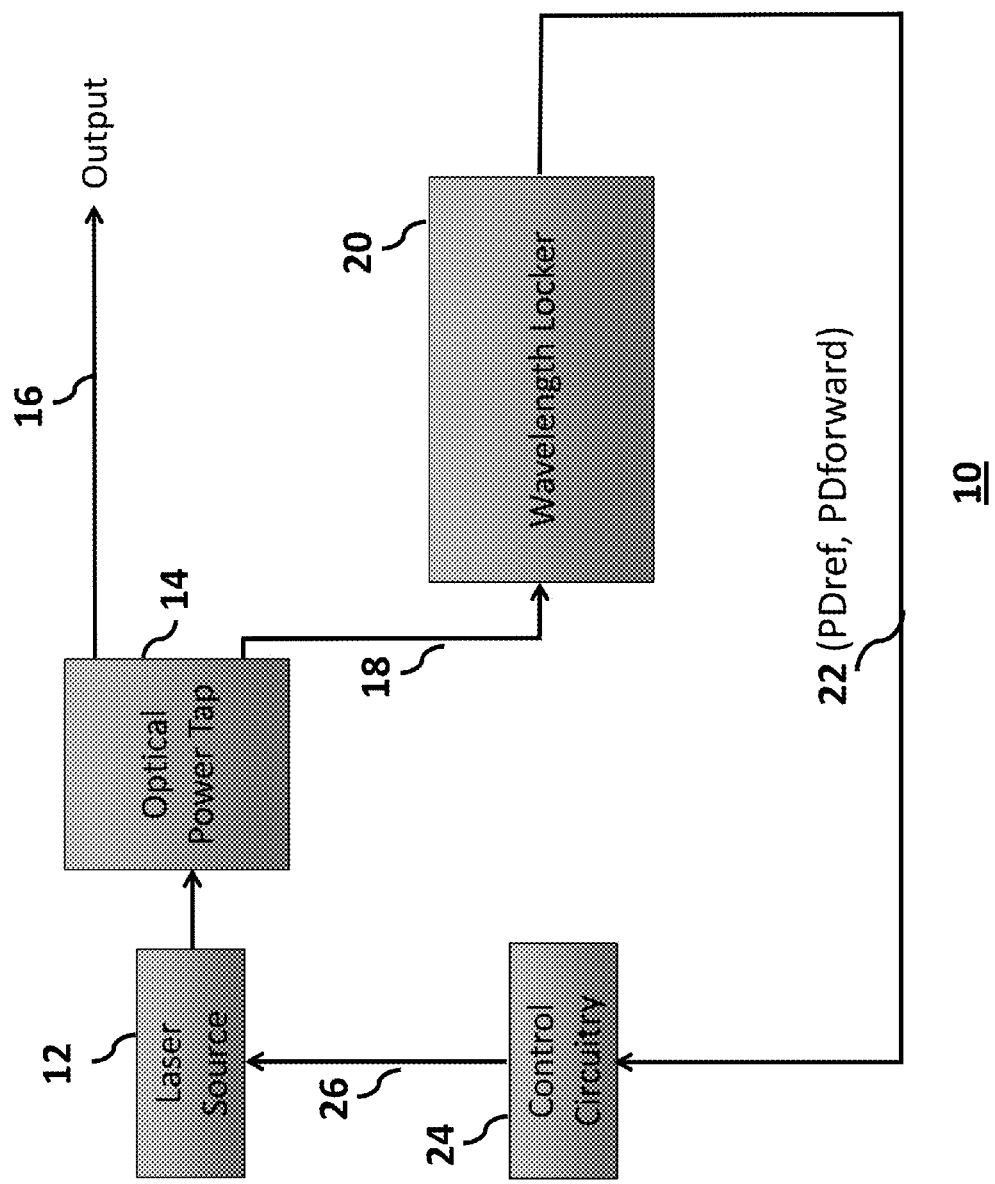
FIG. 1 illustrates a prior art etalon-based wavelength locking arrangement.
Figure 2:
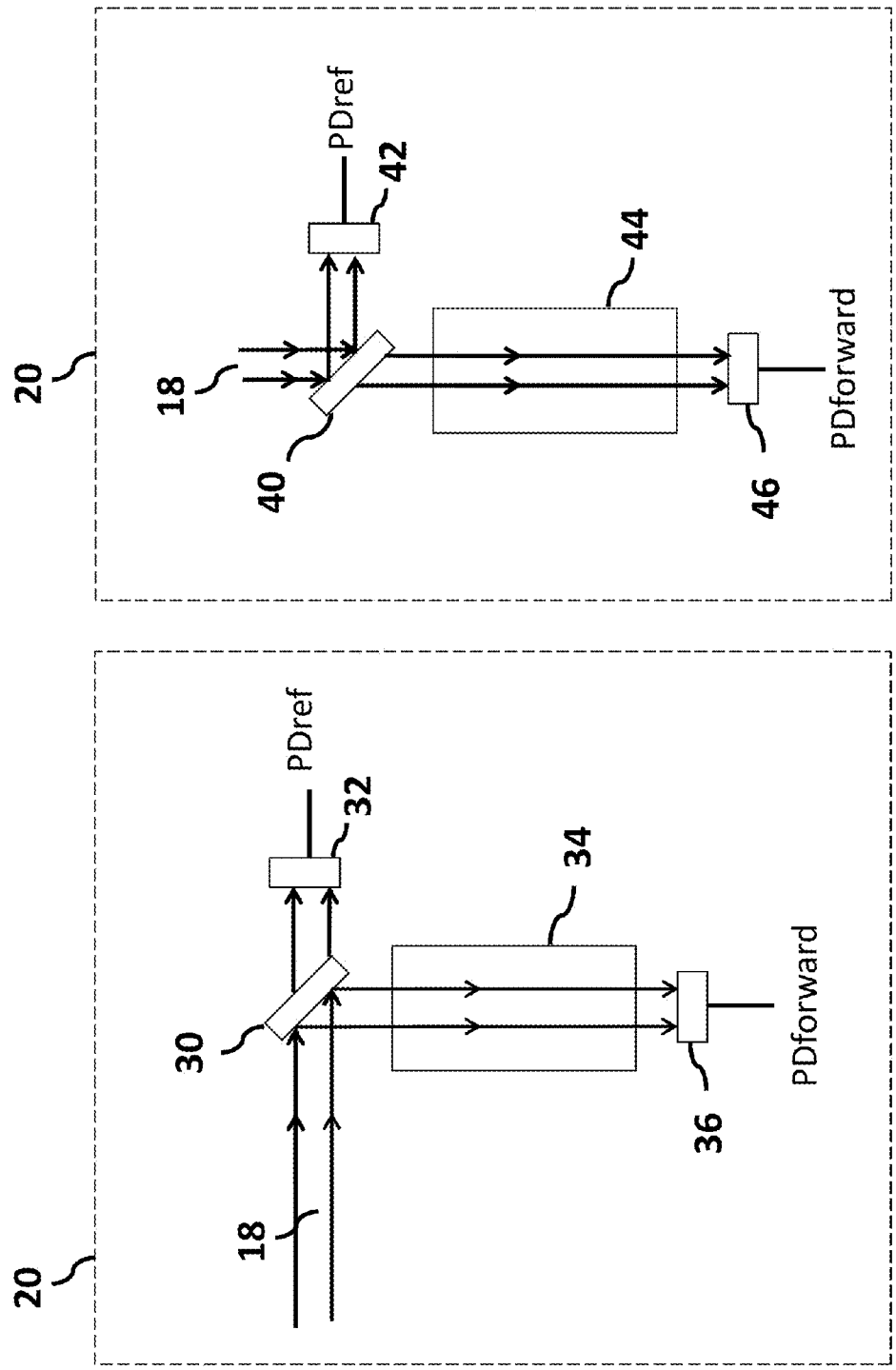
FIGS. 2A and 2B illustrate example wavelength lockers according to the prior art wavelength locking arrangement of FIG. 1.
Figure 3:
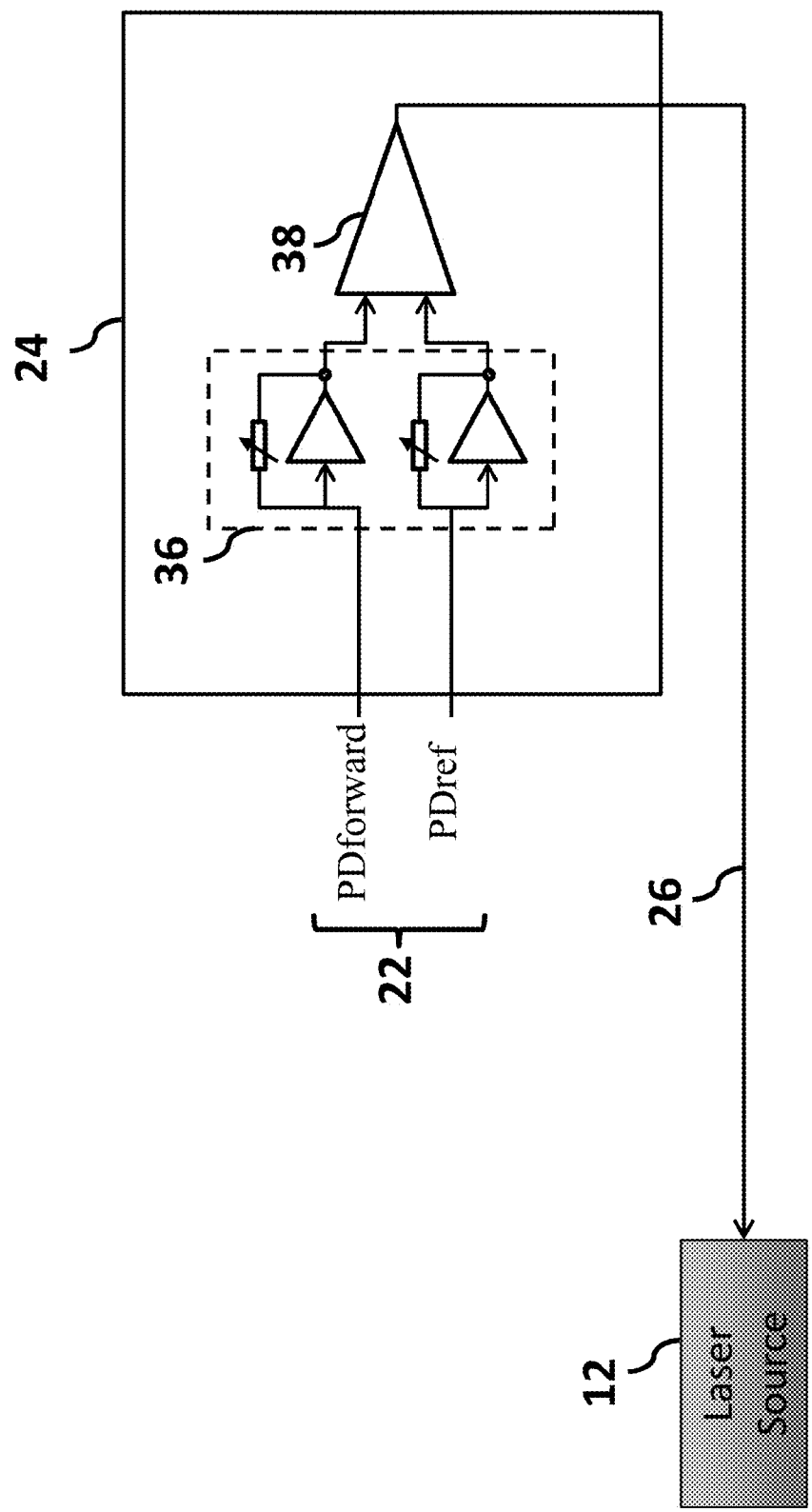
FIG. 3 illustrates control circuitry of the prior art wavelength locking arrangement of FIG. 1.
Figure 4:
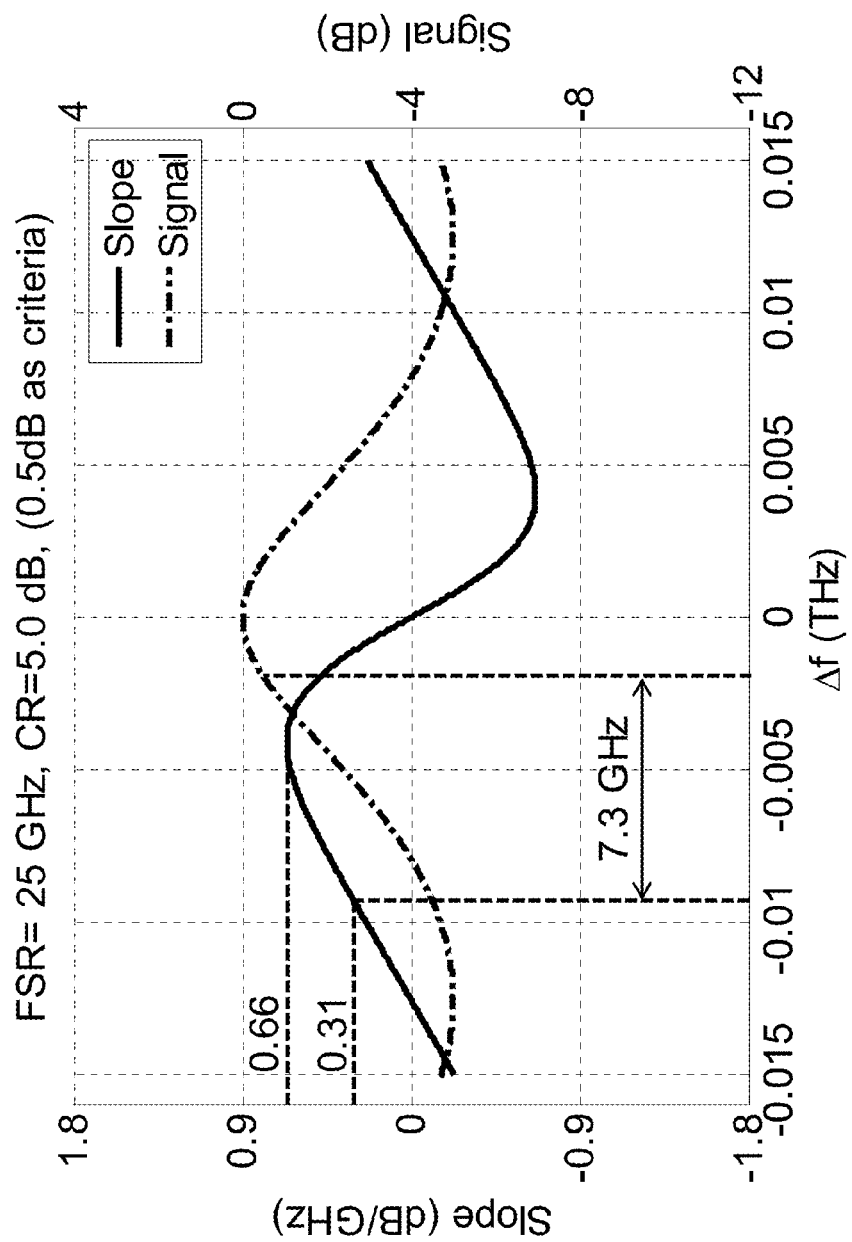
FIG. 4 illustrates the etalon forward transmission signal and its slope of the prior art wavelength locking arrangement of FIG. 1.
Figure 5:
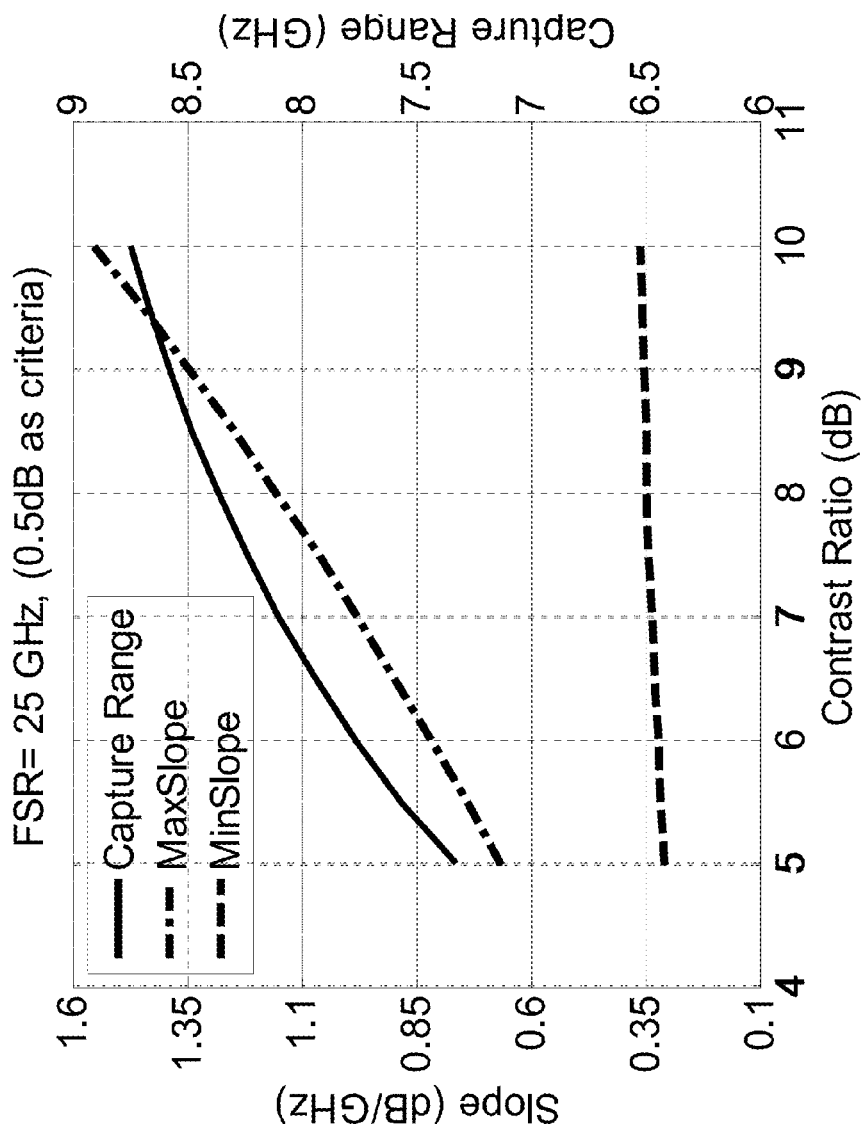
FIG. 5 illustrates the dependence of the etalon forward transmission signal slope and capture range on contrast ratio (CR) of the prior art wavelength locking arrangement of FIG. 1.
Figure 6:
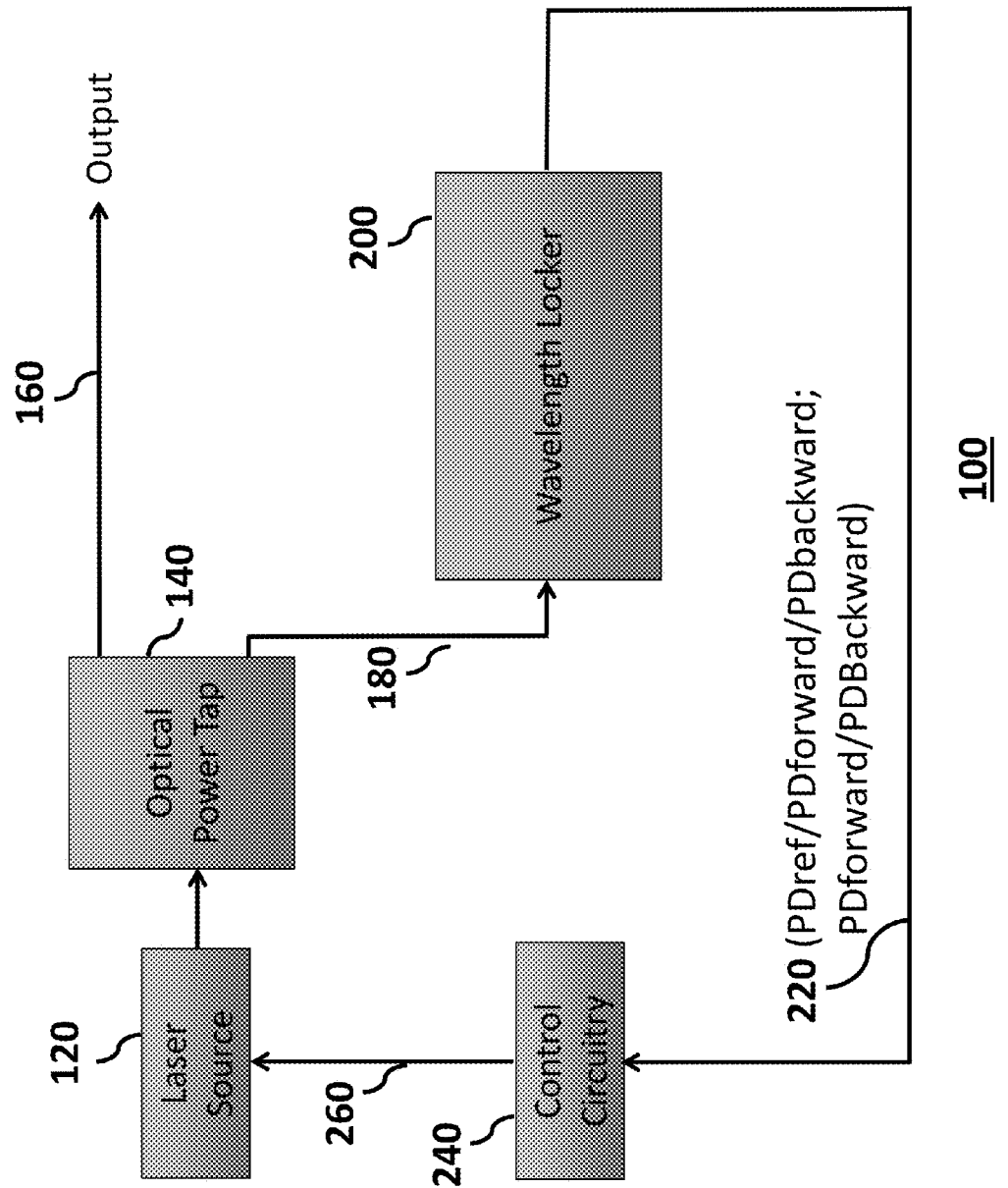
FIG. 6 illustrates an etalon-based wavelength locking arrangement consistent with one aspect of the present disclosure.

FIG. 6 illustrates an etalon-based wavelength locking arrangement 100. Wavelength locking arrangement 100 comprises a laser source 120, an optical power tap 140, an etalon-based wavelength locker 200 and control circuitry 240. Laser source 120 may be a laser diode, for example, in the case where wavelength locking arrangement 100 is used in an optical telecommunications system. Alternatively, laser source 120 may be another type of laser source depending on the particular application with which the locking arrangement 100 is to be used. Examples of such other types of laser sources consistent with the present disclosure include gas lasers, dye lasers (liquid and solid state), solid-state lasers, semiconductor lasers, and free electron lasers.

During operation of the wavelength locking arrangement 100, the optical output of laser source 120 is divided by power tap 140 into a first portion 160, which is provided as an output of wavelength locking arrangement 100, and a second portion 180, which is provided as an input to wavelength locker 200. The ratio of first portion 160 to second portion 180 may be selected to suite a particular application for which wavelength locking arrangement 100 is to be used.

Wavelength locker 200 processes second portion 180 of the laser output to generate wavelength locker signals 220, which are provided to control circuitry 240. For example, consistent with the present disclosure, wavelength locker signals 220 may include a first signal indicative of a forward transmission signal of an etalon within wavelength locker 200, a second signal indicative of a backward reflection signal of the etalon, and a third signal indicative of the second portion 180 of the laser output. Alternatively and also consistent with the present disclosure, wavelength locker signals 220 may include the first and second signals, but not the third signal.

Control circuitry 240 processes wavelength locker signals 220 to produce control signal 260, which is used to control laser source 120 such that the output of laser source 120 maintains desired wavelength characteristics. For example, consistent with the present disclosure, control circuitry 240 may process the aforementioned first, second and third signals, or may process the first and second signals, but not the third signal, to produce control signal 260 such that control signal 260 has a first value indicative of the wavelength of light output from laser source 120 not being locked to a desired wavelength. This could cause appropriate modification of one or more tuning parameters of laser source 120 so as to achieve the desired wavelength lock. Also consistent with the present disclosure, control circuitry 240 may process the aforementioned first, second and third signals, or may process the first and second signals, but not the third signal, to produce control signal 260 such that control signal 260 has a second value indicative of the wavelength of light output from laser source 120 being locked to the desired wavelength. This could result in no modification of the tuning parameter or parameters of laser source 120.

It should be appreciated that control signal 260 may be used to control any relevant tuning parameters of laser source 120 in order to ensure that the output of laser source 120 maintains desired wavelength characteristics. For example, in the case of a laser diode, these tuning parameters may include tuning voltage, temperature, and current. Thus, for example, in the case of temperature and/or drive current being the tuning parameter, control signal 260 may be used to control the drive current of a thermoelectric cooler on which laser source 120 is mounted, changing the current through a heater integrated with the laser, or by changing the drive current of laser source 120 itself, in order to compensate for any wavelength drifts in the output of laser source 120. Other relevant parameters and tuning techniques are discussed in U.S. Pat. No. 6,181,717, entitled "Tunable Semiconductor Laser System," and http://www.rp-photonics.com/wavelength_tuning.html, both of which are hereby incorporated by reference in their entirety. It should also be appreciated that the term "locked" to a desired wavelength does not necessarily mean that the wavelength of light output from laser source 120 is exactly the desired wavelength, but may also include situations where the wavelength of light output from laser source 120 is within an acceptable range of wavelengths about the desired wavelength.

Figure 7:
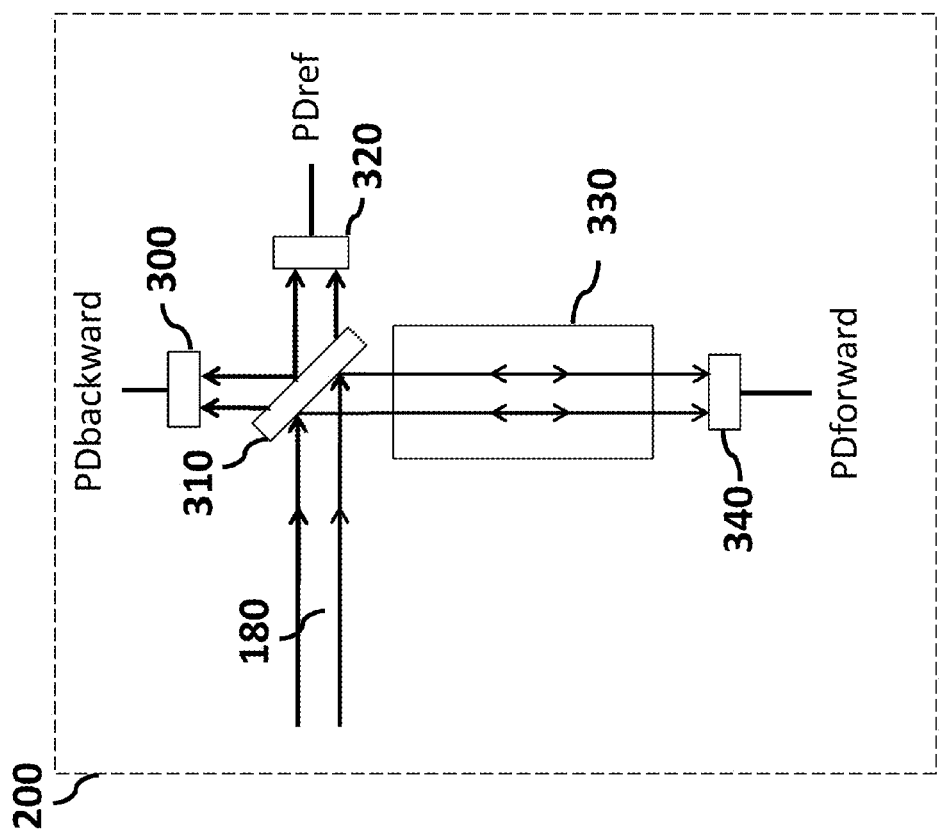
FIG. 7 illustrates a wavelength locker consistent with an additional aspect of the present disclosure.

As shown in FIG. 7, wavelength locker 200 comprises a beam splitter 310, detectors 300, 320 and 340, and an etalon 330. Beam splitter 310 may be, for example, a plate or cube design. Each of detectors 300, 320 and 340 may be, for example, a photodiode or other device for detecting and converting optical signals to electrical signals. Etalon 330 is preferably a Fabry-Pérot etalon, which may be solid or air spaced, single-cavity or multi-cavity, and/or single-step or multi-step.

Second portion 180 of the laser output is split by beam splitter 310 into two portions, one of which is provided to detector 320 and the other of which is provided to etalon 330. The forward transmission signal of etalon 330 (i.e., light transmitted through etalon 330) is provided to detector 340, whereas the backward reflection signal of etalon 330 (i.e., light reflected from etalon 330) is provided to detector 300 through beam splitter 310. Detectors 300, 320 and 340 generate signals PDbackward, PDref and PDforward, respectively, from their respective inputs. PDref, PDbackward and PDforward are provided to control circuitry 240 as wavelength locker signals 220 (FIG. 6).

Figure 8:
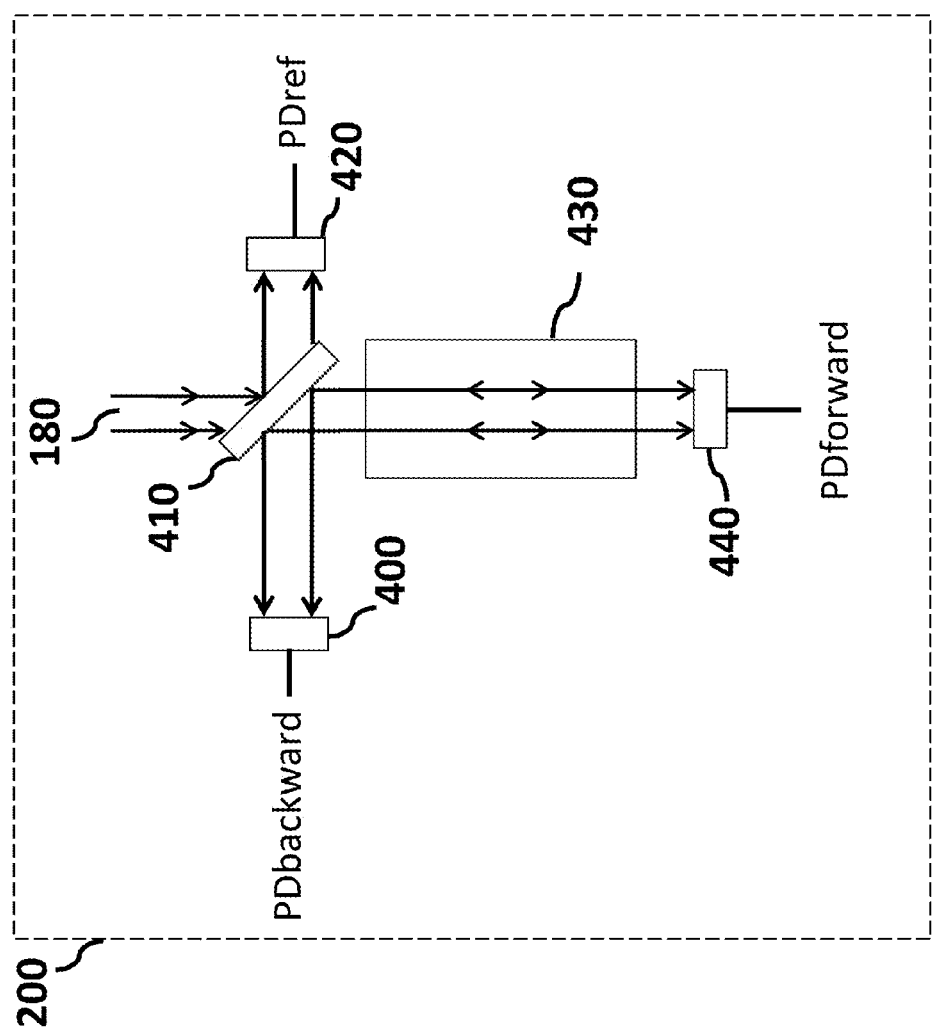
FIG. 8 illustrates a wavelength locker consistent with an additional aspect of the present disclosure.

As shown in FIG. 8, an alternative arrangement of wavelength locker 200 comprises a beam splitter 410, detectors 400, 420 and 440, and an etalon 430. Beam splitter 410 may be, for example, a plate or cube design. Each of detectors 400, 420 and 440 may be, for example, a photodiode or other device for detecting and converting optical signals to electrical signals. Etalon 430 is preferably a Fabry-Pérot etalon, which may be solid or air spaced, single-cavity or multi-cavity, and/or single-step or multi-step.

Second portion 180 of the laser output is split by beam splitter 410 into two portions, one of which is provided to detector 420 and the other of which is provided to etalon 430. The forward transmission signal of etalon 430 (i.e., light transmitted through etalon 430) is provided to detector 440, whereas the backward reflection signal of etalon 430 (i.e., light reflected from etalon 430) is provided to detector 400 via beam splitter 410. Detectors 400, 420 and 440 generate signals PDbackward, PDref and PDforward, respectively, from their respective inputs. Like the arrangement of FIG. 7, PDbackward, PDref and PDforward generated by the arrangement of FIG. 8 are provided to control circuitry 240 as wavelength locker signals 220 (FIG. 6).

Figure 9:
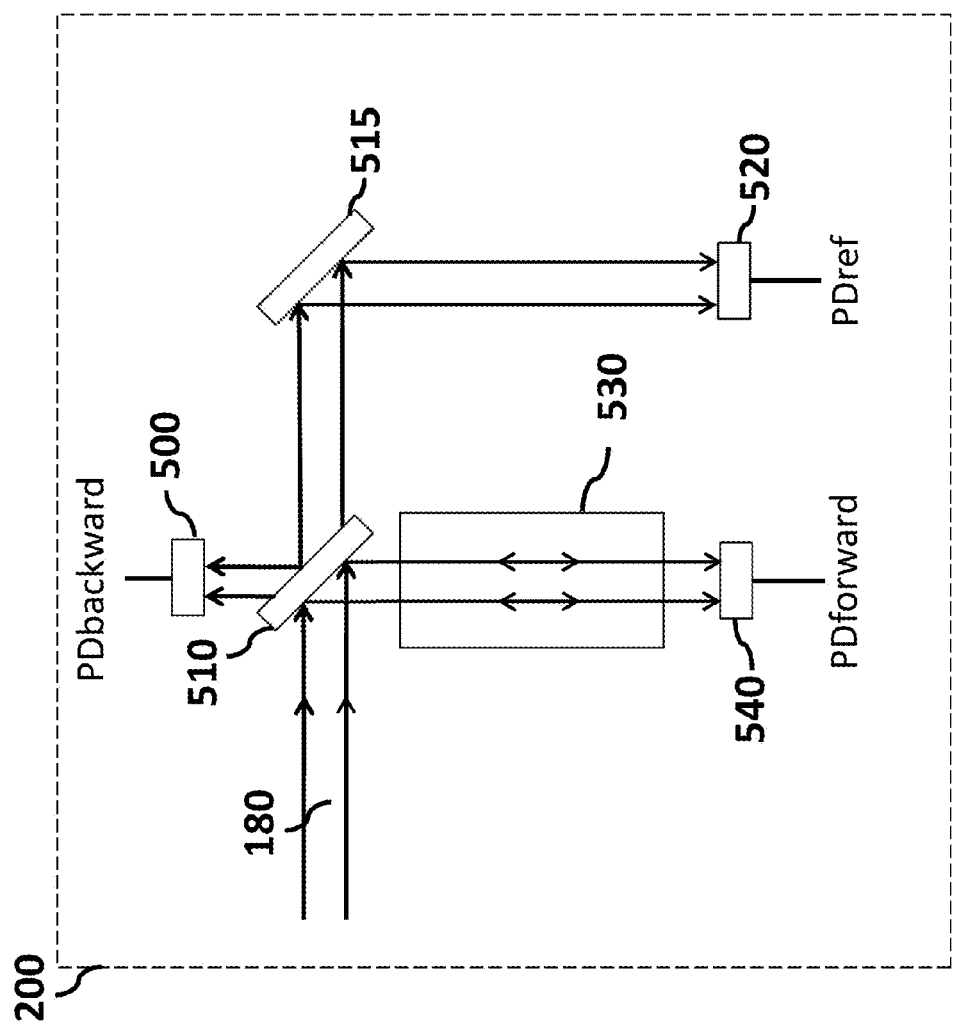
FIG. 9 illustrates a wavelength locker consistent with an additional aspect of the present disclosure.

As shown in FIG. 9, another alternative arrangement of wavelength locker 200 comprises beam splitter 510, mirror 515, detectors 500, 520 and 540, and an etalon 530. Beam splitter 510 may be, for example, a plate or cube design. Mirror 515 may also be replaced by a beam splitter or other suitable device for reflecting light received from beam splitter 510 to detector 520 as described below. Each of detectors 500, 520 and 540 may be, for example, a photodiode or other device for detecting and converting optical signals to electrical signals. In this case, the location of detector 520 is flexible such that the detector 520 can be located next to detector 540 or 500 by rotating mirror 515, thereby allowing advantages in packaging. Etalon 530 is preferably a Fabry-Pérot etalon, which may be solid or air spaced, single-cavity or multi-cavity, and/or single-step or multi-step.

Second portion 180 of the laser output is split by beam splitter 510 into two portions, one of which is provided to mirror 515 and the other of which is provided to etalon 530. The light provided to mirror 515 is reflected from mirror 515 onto detector 520. The forward transmission signal of etalon 530 (i.e., light transmitted through etalon 530) is provided to detector 540, whereas the backward reflection signal of etalon 530 (i.e., light reflected from etalon 530) is provided to detector 500 via beam splitter 510. Detectors 500, 520 and 540 generate signals PDbackward, PDref and PDforward, respectively, from their respective inputs. Like the arrangements of FIGS. 7 and 8, PDbackward, PDref and PDforward generated by the arrangement of FIG. 9 are provided to control circuitry 240 as wavelength locker signals 220 (FIG. 6).

Figure 10:
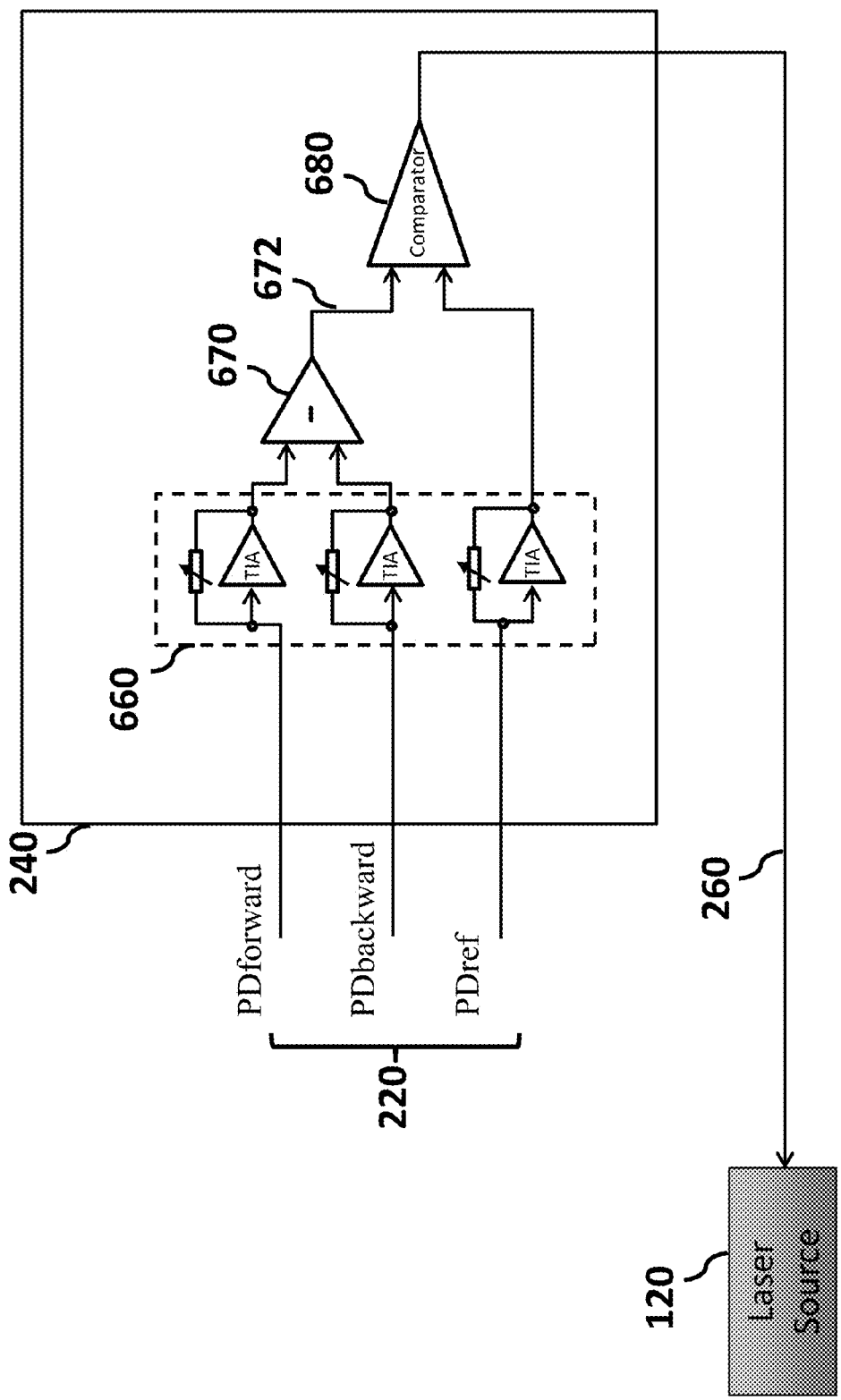
FIG. 10 illustrates control circuitry consistent with an additional aspect of the present disclosure.

As shown in FIG. 10, control circuitry 240 comprises gain-adjustable transimpedance amplifiers 660, an operational amplifier 670, and a comparator 680. PDforward and PDbackward are converted to voltage outputs by amplifiers 660, which are provided to operational amplifier 670. PDref is also converted to a voltage output by amplifiers 660, which is provided to comparator 680. Operational amplifier 670 calculates a difference signal 672 representing the difference in intensity between PDforward and PDbackward. Difference signal 672 is provided to comparator 680 where it is compared to PDref to produce control signal 260. As described above, control signal 260 is used to control laser source 120 such that the output of laser source 120 maintains desired wavelength characteristics. For example, control signal 260 may have a first value when difference signal 672 is not the same as PDref or when difference signal 672 deviates from PDref beyond an acceptable amount, indicating that the wavelength of the output of laser source 120 is not locked to a desired wavelength. This could cause appropriate modification of one or more tuning parameters of laser source 120 so as to achieve the desired wavelength lock. Alternatively, control signal 260 may have a second value when difference signal 672 is the same as PDref or when difference signal 672 deviates from PDref, but by an acceptable amount, indicating that the wavelength of the output of laser source 120 is locked to the desired wavelength. This could result in no modification of the tuning parameter or parameters of laser source 120.

Thus, unlike the prior art wavelength locking arrangement 10, which provides control signal 22 based on only PDforward and PDref, wavelength locking arrangement 100 provides control signal 220 based on PDforward, PDref and PDbackward. For example, instead of just comparing PDforward to PDref to provide control signal 22 as is done by wavelength locking arrangement 10, the wavelength locking arrangement 100 compares the difference between PDforward and PDbackward to PDref to provide control signal 220. This provides wavelength locking arrangement 100 with improved locking slope and capture range characteristics, an explanation of which is as follows.

As described above, difference signal 672 is expressed as (PDforward-PDbackward), which is representative of (T-R) where T is the etalon forward transmission signal and R is the etalon backward reflection signal. If the beam splitter 310/410/510 has a transmittance of $\tau$, $$T - R = T - \tau(1 - T)$$

$$= \frac{1 - \tau \mathcal{F} \sin^2\left(\frac{\pi f}{FSR}\right)}{1 + \mathcal{F} \sin^2\left(\frac{\pi f}{FSR}\right)}$$

The slope is $$\frac{\partial(T - R)}{\partial f} = \frac{-\pi \mathcal{F}(1 + \tau) \sin\left(\frac{2\pi f}{FSR}\right)}{FSR} T^2$$

Figure 11:
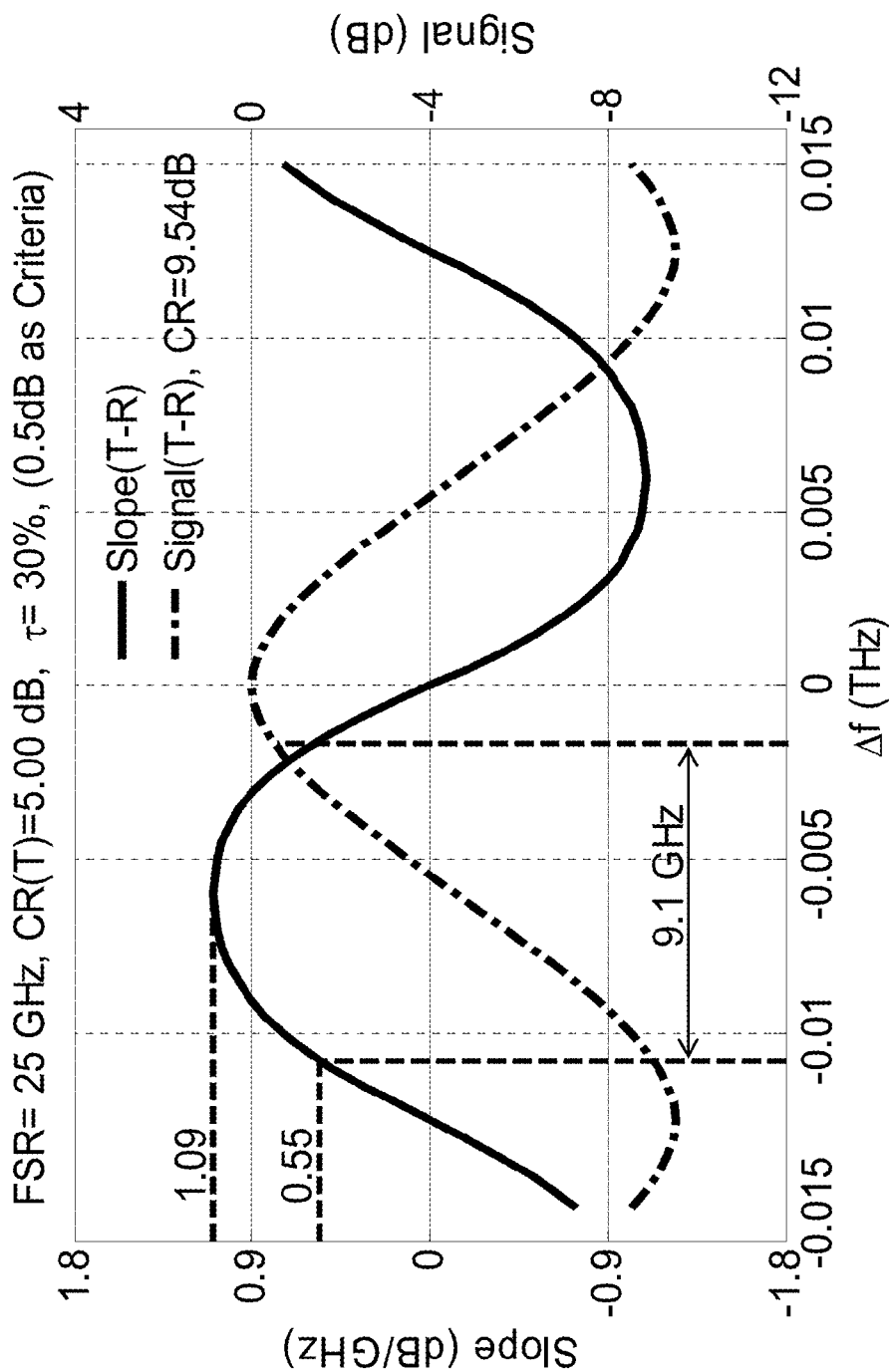
FIG. 11 illustrates a difference signal representative of an etalon forward transmission signal minus backward reflection signal, and the difference signal's slope consistent with an additional aspect of the present disclosure.
Figure 12:
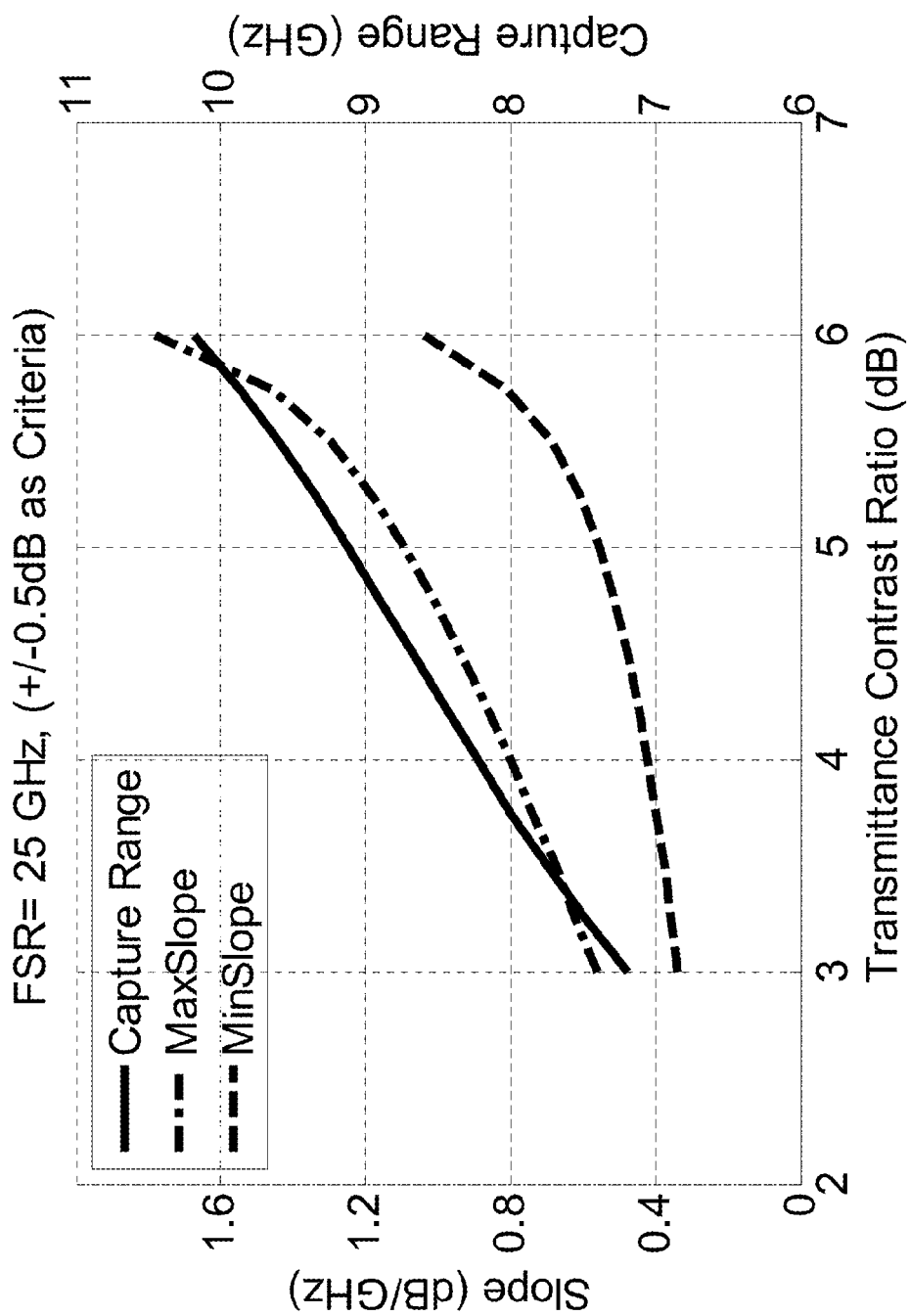
FIG. 12 shows the dependence of slope and capture range on the forward transmission signal minus the backward reflection signal contrast ratio consistent with an additional aspect of the present disclosure.

For FSR=25 GHz, CR=5 dB and $\tau$=30%, difference signal 672 and its slope are plotted in FIG. 11. FIG. 12 shows the dependence of slope and capture range on the forward transmission signal minus the backward reflection signal contrast ratio for wavelength locking arrangement 100. Comparing wavelength locking arrangement 100 versus wavelength locking arrangement 10 for the same free spectral range (FSR) and contrast ratio (CR), the capture range of wavelength locking arrangement 100 increases from 7.3 GHz to 9.1 GHz, and the slope is above the minimum required to assure enough sensitivity.

In addition, although free spectral range (FSR) and contrast ratio (CR) are angle sensitive and can be monitored in the etalon forward transmission signal via PDforward, this effect is much more pronounced when monitored in the etalon backward reflection signal via PDbackward. Therefore, during assembly of wavelength locker 200, in addition to monitoring the forward transmission signal of etalon 330/430/530 via PDforward, one may monitor the backward reflection signal of etalon 330/430/530 via PDbackward in order to make a very precise angular alignment of the optical axis of etalon 330/430/530 with the second portion 180 of the laser output as the second portion 180 enters etalon 330/430/530. For example, when PDbackward reaches a maximum, this indicates that the aligning angle is zero, i.e., that the direction of propagation of the second portion 180 of the laser output as it enters etalon 330/430/530 is parallel to the optical axis (A) of etalon 330/430/530 as shown in FIG. 15. Because laser source 120 cannot scan a full FSR, there is no way to accurately determine how well it is performing using only PDforward. Therefore, having access to signal PDbackward is very useful for aligning etalon 330/430/530. In addition, in situations when etalon 330/430/530 is a part of a small, integrated optical system, where physical access to the etalon backward reflection signal via, for example, an optical tap, is not practical, having access to PDbackward for aligning etalon 330/430/530 is especially useful.

Figure 13:
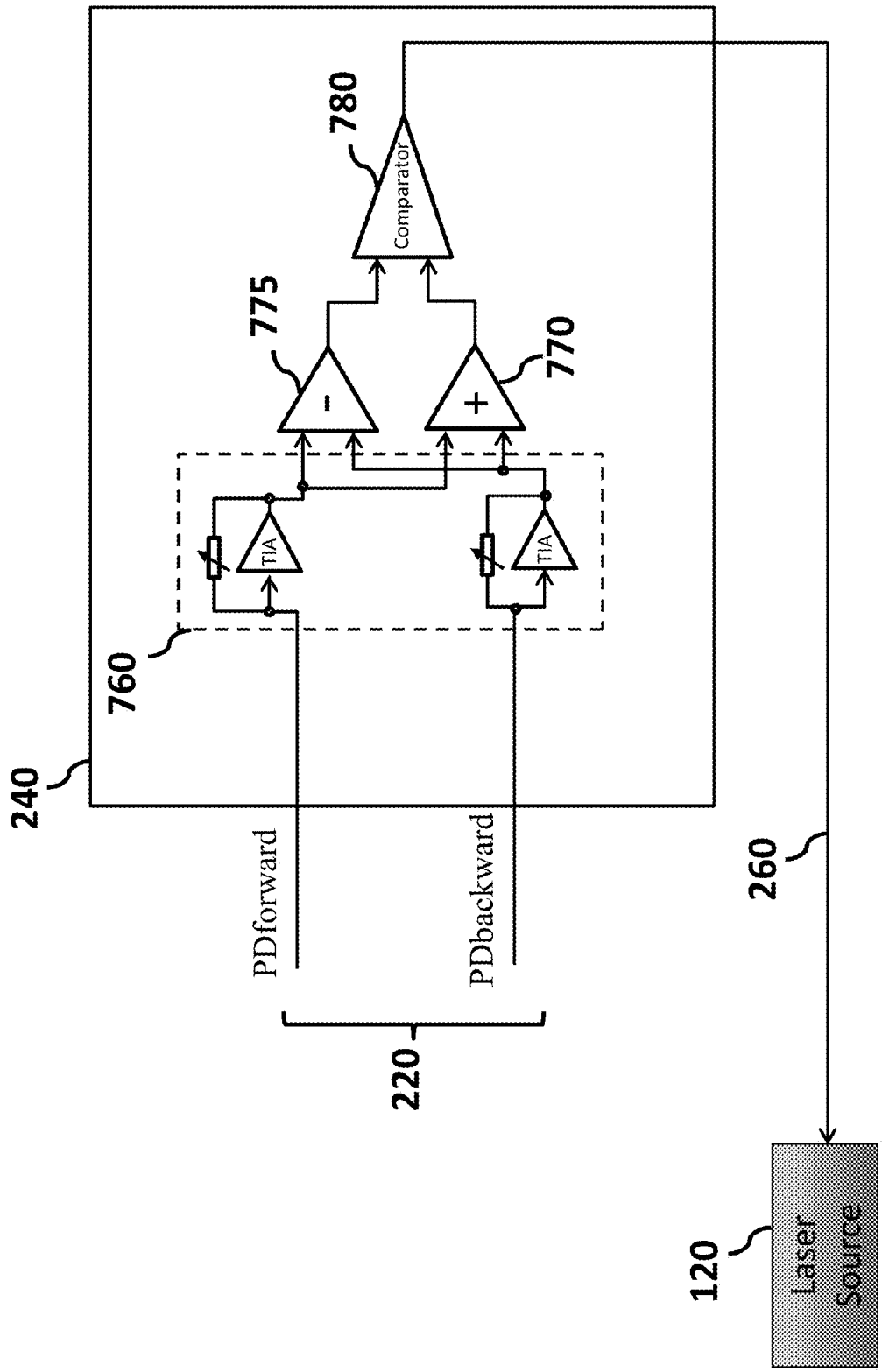
FIG. 13 illustrates control circuitry consistent with an additional aspect of the present disclosure.

As shown in FIG. 13, an alternative arrangement of control circuitry 240 comprises gain-adjustable transimpedance amplifiers 760, operational amplifiers 770 and 775, and a comparator 780. PDforward and PDbackward are converted to voltage outputs by amplifiers 760, which are provided to operational amplifiers 770 and 775 as shown. The resulting signals, which are representative of (PDforward+PDbackward) and (PDforward-PDbackward), are provided to comparator 680 to produce control signal 260. As described above, control signal 260 is used to control laser source 120 such that the output of laser source 120 maintains desired wavelength characteristics. For example, control signal 260 may have a first value when the signal representative of (PDforward+PDbackward) is not the same as the signal representative of (PDforward-PDbackward) or when the two signals deviate beyond an acceptable amount, indicating that the wavelength of the output of laser source 120 is not locked to a desired wavelength. This could cause appropriate modification of one or more tuning parameters of laser source 120 so as to achieve the desired wavelength lock. Alternatively, control signal 260 may have a second value when the signal representative of (PDforward+PDbackward) is the same as the signal representative of (PDforward-PDbackward) or when the two signals deviate, but by an acceptable amount, indicating that the wavelength of the output of laser source 120 is locked to the desired wavelength. This could result in no modification to the tuning parameter or parameters of laser source 120.

Thus, unlike the controller circuitry 240 configuration of FIG. 10, the controller circuitry 240 configuration of FIG. 13 does not require the use of PDref to produce control signal 260 and eliminates the need for detector 320/420/520 of wavelength locker 200. Also, by using (PDforward+PDbackward) as a reference signal to be compared with (PDforward-PDbackward), the reference signal can be adjusted to provide flexibility as to where to lock the laser output.

Figure 14:
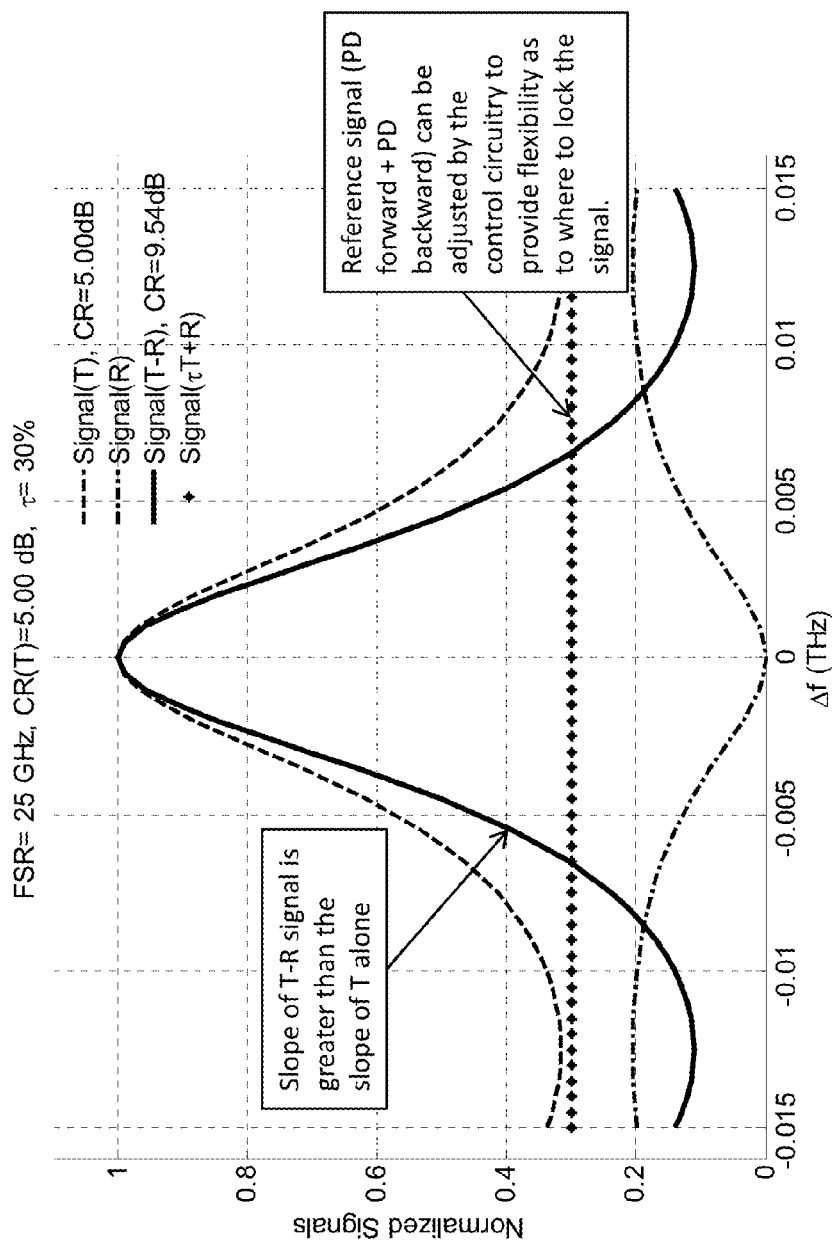
FIG. 14 illustrates the improved spectral characteristics consistent with an additional aspect of the present invention as compared to the prior art.

FIG. 14 further illustrates the improvements in capture range and locking slope across the capture range provided by the present invention over the prior art.

Other embodiments will be apparent to those skilled in the art from consideration of the specification. For example, although control circuitry 240 has been described as comprising analog components (e.g., amplifiers 660/760, operational amplifiers 670/770/775 and comparators 680/780), control circuitry 240 can alternatively comprise digital equivalents of some or all of those analog components (for example, a processor) such that control circuitry 240 processes wavelength locker signals 260, at least in part, in the digital domain. Likewise, wavelength locking apparatus 100 need not include optical power tap 140. For example, the output of laser source 120 could be provided directly to wavelength locker 200 and the output of wavelength locking apparatus 100 could be provided by tapping the forward transmission signal from etalon 330/430/530. In this configuration, wavelength locker 200 would essentially play role of optical power tap 140. It is intended that the specification and examples be considered as exemplary only, with a true scope and spirit of the invention being indicated by the following claims.

What is claimed is:

1. An apparatus for producing a control signal for a laser source, comprising:
    a beam splitter that receives light from a laser source;
    an etalon configured to receive a first portion of the light from the laser source;
    a first detector that detects a forward transmission signal of the etalon to provide a first signal, the forward transmission signal being a first part of the first portion of the light from the laser source, the forward transmission signal being reflected by the beam splitter and passing through the etalon to the first detector;
    a second detector that detects a backward reflection signal of the etalon to provide a second signal, the backward reflection signal being a second part of the first portion of the light from the laser source, the backward reflection signal being output from the etalon and passing through the beam splitter to the second detector;
    a third detector that detects a second portion of the light from the laser source to provide a third signal, the second portion of the light from the laser source passing through the beam splitter to the third detector; and
    circuitry that provides the control signal based on the first signal, the second signal and the third signal,
    wherein the control signal is indicative of a comparison of (a) a difference between the first and second signals and (b) the third signal,
    wherein the circuitry includes:
    an operational amplifier arranged to subtract the second signal from the first signal to produce a fourth signal indicative of the difference between the first signal and the second signal; and
    a comparator arranged to compare the fourth signal to the third signal.

2. The apparatus of claim 1, wherein the etalon is a Fabry-Perot etalon.

3. The apparatus of claim 1, wherein each of the first, second and third detectors is a photodiode.

4. An apparatus, comprising:
    a beam splitter that receives light from a laser source;
    an etalon configured to receive a first portion of the light from the laser source;
    a first detector that detects a forward transmission signal of the etalon to provide a first signal, the forward transmission signal being a first part of the first portion of the light from the laser source, the forward transmission signal being reflected by the beam splitter and passing through the etalon to the first detector;
    a second detector that detects a backward reflection signal of the etalon to provide a second signal, the backward reflection signal being a second part of the first portion of the light from the laser source, the backward reflection signal being output from the etalon and passing through the beam splitter to the second detector;
    a third detector that detects a second portion of the light from the laser source to provide a third signal, the second portion of the light from the laser source passing through the beam splitter to the third detector; and
    first, second, and third amplifiers that receive the first, second, and third signals, respectively, the first, second, and third amplifiers supplying first, second, and third outputs, respectively,
    an operational amplifier that receives the first and second outputs and supplies a fourth output; and
    a comparator that receives the third output and the fourth output and outputs a control signal based on the third and fourth outputs, such that a wavelength of the light is based on the control signal.

5. An apparatus in accordance with claim 4, wherein each of the first, second, and third amplifiers is a trans-impedance amplifier.

* * * * *